(12) United States Patent
Katrak et al.

(10) Patent No.: US 10,720,674 B2
(45) Date of Patent: Jul. 21, 2020

(54) BATTERY MANAGEMENT SYSTEM THAT DETECTS COMMUNICATION FAULTS

(71) Applicant: LG Chem, Ltd., Seoul (KR)

(72) Inventors: Kerfegar K. Katrak, Fenton, MI (US); Nitin Bharane, Rochester Hills, MI (US)

(73) Assignee: LG Chem, Ltd., Seoul (KR)

( * ) Notice: Subject to any disclaimer, the term of this patent is extended or adjusted under 35 U.S.C. 154(b) by 261 days.

(21) Appl. No.: 16/031,333

(22) Filed: Jul. 10, 2018

(65) Prior Publication Data

US 2019/0036174 A1 Jan. 31, 2019

Related U.S. Application Data

(60) Provisional application No. 62/538,934, filed on Jul. 31, 2017.

(51) Int. Cl.
| | |
|---|---|
| *H01M 10/42* | (2006.01) |
| *H04L 1/00* | (2006.01) |
| *H04Q 9/00* | (2006.01) |
| *G01R 35/00* | (2006.01) |
| *G01R 31/3835* | (2019.01) |
| *H01M 10/48* | (2006.01) |
| *G01R 31/396* | (2019.01) |

(52) U.S. Cl.
CPC ...... *H01M 10/425* (2013.01); *G01R 31/3835* (2019.01); *G01R 35/00* (2013.01); *H04L 1/0061* (2013.01); *H04Q 9/00* (2013.01); *G01R 31/396* (2019.01); *H01M 10/482* (2013.01); *H04Q 2209/10* (2013.01); *H04Q 2209/30* (2013.01); *H04Q 2209/86* (2013.01)

(58) Field of Classification Search
CPC .................................................. H01M 10/425
See application file for complete search history.

(56) References Cited

U.S. PATENT DOCUMENTS

2019/0074556 A1* 3/2019 Onoda ................ H01M 10/482

OTHER PUBLICATIONS

Wikipedia contributors. "Cyclic redundancy check." Wikipedia, The Free Encyclopedia. Wikipedia, The Free Encyclopedia, May 18, 2020. Web. May 22, 2020. (Year: 2020).*
U.S. Appl. No. 16/013,130, filed Jun. 20, 2018 entitled Battery Cell Management System That Detects Data Misalignment Between Battery Cell Voltage Values and Battery Cell Overvoltage Flags.
U.S. Appl. No. 16/028,092, filed Jul. 5, 2018 entitled Battery Cell Management System.
U.S. Appl. No. 16/032,293, filed Jul. 11, 2018 entitled Battery Management System.
U.S. Appl. No. 16/046,965, filed Jul. 26, 2018 entitled Self-Diagnosing Battery Cell Monitoring System.

* cited by examiner

*Primary Examiner* — Daniel J Cavallari
(74) *Attorney, Agent, or Firm* — Buckert Patent & Trademark Law Firm PC; John F. Buckert

(57) ABSTRACT

A battery management system includes a microcontroller having first and second applications. The first application transitions a contactor to an open operational position if a first CRC diagnostic flag is equal to a first encoded fault value. The second application transitions the contactor to the open operational position if a second CRC diagnostic flag is equal to a second encoded fault value. The first and second encoded fault values have a Hamming distance of at least four from one another.

9 Claims, 10 Drawing Sheets

MESSAGE FROM MICROCONTROLLER TO VOLTAGE MONITORING IC

| BINARY COMMAND | CRC VALUE |
|---|---|
| 1111 | (CALCULATED) |

MESSAGE FROM VOLTAGE MONITORING IC TO MICROCONTROLLER

| OVERVOLTAGE FAULT BITS | CRC DIAGNOSTIC BIT | COMMUNICATION TIME-OUT BIT | TIMING ERROR BIT | CRC VALUE |
|---|---|---|---|---|
| 0000 | 1 - FAULT | 1 - FAULT | 1 - FAULT | (CALCULATED) |
| 1000 | 0 - NON-FAULT | 0 - NON-FAULT | 0 - NON-FAULT | (CALCULATED) |

| FLAG NAME | ENCODED NON-FAULT VALUE (HEXADECIMAL) | ENCODED FAULT VALUE (HEXADECIMAL) |
|---|---|---|
| FIRST CRC DIAGNOSTIC FLAG | C6 | 6C |

| FLAG NAME | ENCODED NON-FAULT VALUE (HEXADECIMAL) | ENCODED FAULT VALUE (HEXADECIMAL) |
|---|---|---|
| SECOND CRC DIAGNOSTIC FLAG | 39 | 93 |

BATTERY MANAGEMENT SYSTEM THAT DETECTS COMMUNICATION FAULTS

CROSS-REFERENCE TO RELATED APPLICATION

This application claims priority to U.S. Provisional Patent Application No. 62/538,934 filed on Jul. 31, 2017, the entire contents of which are hereby incorporated by reference herein.

BACKGROUND

The inventors herein have recognized a need for an improved battery management system that redundantly determines when communication faults are detected at a voltage monitoring IC that receives messages from the microcontroller via a serial communication bus, utilizing first and second diagnostic flags, and to redundantly take safe action if either of the first and second diagnostic flags indicate a fault condition.

SUMMARY

A battery management system in accordance with an exemplary embodiment is provided. The battery management system includes a microcontroller having first and second applications. The battery management system further includes a voltage monitoring IC operably coupled to the microcontroller utilizing a serial communication bus. The microcontroller sends a first message to the voltage monitoring IC. The first message has first binary command and a first CRC value. The voltage monitoring IC calculates a second CRC value based on the first binary command in the first message. The voltage monitoring IC sets a first CRC diagnostic bit equal to a fault value if the first CRC value is not equal to the second CRC value. The voltage monitoring IC sends a second message to the microcontroller having first binary voltage information and the first CRC diagnostic bit. The microcontroller saves second and third CRC diagnostic bits to first and second memory locations, respectively, that are identical to the first CRC diagnostic bit. The first application sets a first CRC diagnostic flag to a first encoded fault value if the second CRC diagnostic bit is equal to the fault value. The first application transitions a contactor to an open operational position if the first CRC diagnostic flag is equal to the first encoded fault value. The second application sets a second CRC diagnostic flag to a second encoded fault value if the third CRC diagnostic bit is equal to the fault value. The second application transitions the contactor to the open operational position if the second CRC diagnostic flag is equal to the second encoded fault value. The first and second encoded fault values have a Hamming distance of at least four from one another.

A battery management system in accordance with another exemplary embodiment is provided. The battery management system includes a microcontroller having first and second applications. The battery management system further includes a voltage monitoring IC operably coupled to the microcontroller utilizing a serial communication bus. The microcontroller iteratively sends a first message to the voltage monitoring IC. Each first message has a first binary command and a first communication time-out bit. The voltage monitoring IC determines a number of the first messages having missing bits in the first binary command. The voltage monitoring IC sets a second communication time-out bit equal to a fault value if the number of the first messages having missing bits in the first binary command is greater than a threshold number of messages. The voltage monitoring IC sends a second message to the microcontroller having first binary voltage information and the second communication time-out bit. The microcontroller saves third and fourth communication time-out bits to first and second memory locations, respectively, that are identical to the second communication time-out bit. The first application sets a first communication time-out diagnostic flag to a first encoded fault value if the third communication time-out bit is equal to the fault value. The first application transitions a contactor to an open operational position if the first communication time-out diagnostic flag is equal to the first encoded fault value. The second application sets a second communication time-out diagnostic flag to a second encoded fault value if the fourth communication time-out bit is equal to the fault value. The second application transitions the contactor to the open operational position if the second communication time-out diagnostic flag is equal to the second encoded fault value. The first and second encoded fault values have a Hamming distance of at least four from one another.

A battery management system in accordance with another exemplary embodiment is provided. The battery management system includes a microcontroller having first and second applications. The battery management system further includes a voltage monitoring IC operably coupled to the microcontroller utilizing a serial communication bus. The microcontroller iteratively sends a first message to the voltage monitoring IC. Each first message has a first binary command and a first timing error bit. The voltage monitoring IC determines a number of the first messages having timing errors resulting in missing bits in the first binary command. The voltage monitoring IC sets a second timing error bit equal to a fault value if the number of the first messages having timing errors is greater than a threshold number of messages. The voltage monitoring IC sends a second message to the microcontroller having first binary voltage information and the second timing error bit. The microcontroller saves third and fourth timing error bits to first and second memory locations, respectively, that are identical to the second timing error bit. The first application sets a first timing error diagnostic flag equal to a first encoded fault value if the third timing error bit is equal to the fault value. The first application transitions a contactor to an open operational position if the first timing error diagnostic flag is equal to the first encoded fault value. The second application sets a second timing error diagnostic flag to a second encoded fault value if the fourth timing error bit is equal to the fault value. The second application transitions the contactor to the open operational position if the second timing error diagnostic flag is equal to the second encoded fault value. The first and second encoded fault values have a Hamming distance of at least four from one another.

BRIEF DESCRIPTION OF THE DRAWINGS

FIG. 2 is a schematic of a message sent from a microcontroller to a voltage monitoring IC in the battery management system of FIG. 1;

FIG. 3 is a schematic of a message sent from the voltage monitoring IC to the microcontroller in the battery management system of FIG. 1;

FIG. 4 is a table having an encoded fault value and an encoded non-fault value for a first CRC diagnostic flag utilized in the battery management system of FIG. 1;

FIG. 5 is a table having an encoded fault value and an encoded non-fault value for a second CRC diagnostic flag utilized in the battery management system of FIG. 1;

DETAILED DESCRIPTION

Figure 1:
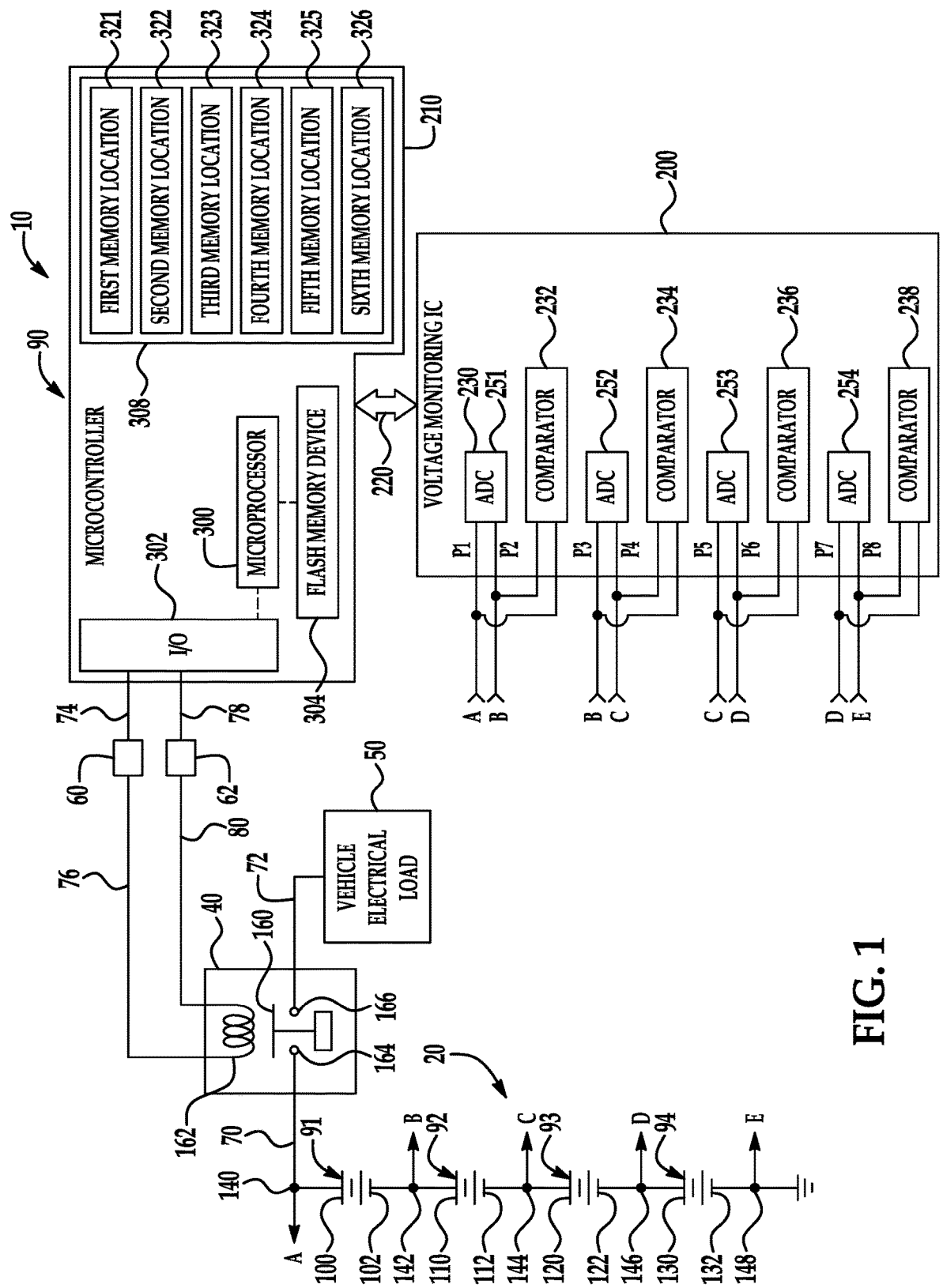
FIG. 1 is a schematic of a vehicle having a battery pack and a battery management system in accordance with an exemplary embodiment.

Referring to FIG. 1, a vehicle 10 is provided. The vehicle 10 includes a battery pack 20, a contactor 40, a vehicle electrical load 50, voltage drivers 60, 62, electrical lines 70, 72, 74, 76, 78, 80, and a battery management system 90.

An advantage of the battery management system 90 is that the system 90 redundantly determines when communication faults are detected at a voltage monitoring IC 200 that receives messages from the microcontroller 210 via a serial communication bus 220, utilizing first and second diagnostic flags, and to redundantly take safe action if either of the first and second diagnostic flags indicate a fault condition.

For purposes of understanding, a few terms utilized herein will be described.

The term "node" or "electrical node" refers to a region or a location in an electrical circuit.

The term "IC" refers to an integrated circuit.

The term "CRC" refers to a cyclic redundancy check which is a technique used to detect errors in digital data.

The term "CRC value" refers to a value determined by a cyclic redundancy check algorithm.

The battery pack 20 includes first, second, third, fourth battery cells 91, 92, 93, 94 that are electrically coupled in series to one another. The first battery cell 91 includes a positive terminal 100 and a negative terminal 102, and the second battery cell 92 includes a positive terminal 110 and a negative terminal 112. Further, the third battery cell 93 includes a positive terminal 120 and a negative terminal 122, and the fourth battery cell 94 includes a positive terminal 130 and a negative terminal 132. The negative terminal 100 is electrically coupled to the positive terminal 110, and the negative terminal 112 is electrically coupled to the positive terminal 120. Further, the negative terminal 122 is electrically coupled to the positive terminal 130, and the negative terminal 132 is electrically coupled to electrical ground.

An electrical node 140 is electrically coupled to the positive terminal 100 of the first battery cell 91, and is further electrically coupled to the analog-to-digital converter 230, in the voltage monitoring IC 200. Also, an electrical node 142 is electrically coupled to the positive terminal 110 of the second battery cell 92, and is further electrically coupled to the voltage monitoring IC 200. Further, an electrical node 144 is electrically coupled to the positive terminal 120 of the third battery cell 93, and is further electrically coupled to the voltage monitoring IC 200. Also, an electrical node 146 is electrically coupled to the positive terminal 130 of the fourth battery cell 94, and is further electrically coupled to the voltage monitoring IC 200. Further, an electrical node 148 is electrically coupled to electrical ground, and is further electrically coupled to the voltage monitoring IC 200.

The contactor 40 has a contact 160, a contactor coil 162, a first electrical node 164, and a second electrical node 166. The first electrical node 164 is electrically coupled to the positive terminal 100 of the first battery cell 91 via the electrical line 70. The second electrical node 166 is electrically coupled to the vehicle electrical load 50 via the electrical line 72. A first end of the contactor coil 162 is electrically coupled to the voltage driver 60 via the electrical line 76. The voltage driver 60 is further electrical coupled to the digital input-output device 302 of the microcontroller 210 via the electrical line 74. A second end of the contactor coil 162 is electrically coupled to the voltage driver 62 via the electrical line 80. The voltage driver 62 is further electrically coupled to the digital input-output device 302 of the microcontroller 210 via the electrical line 78.

When the microcontroller 210 generates first and second control signals that are received by the voltage drivers 60, 62, respectively, the contactor coil 162 is energized which transitions the contact 160 to a closed operational state, which results in the vehicle electrical load 50 receiving a voltage from the battery pack 20. Alternately, when the microcontroller 210 generates third and fourth control signals that are received by the voltage drivers 60, 62, respectively, the contactor coil 162 is de-energized which transitions the contact 160 to an open operational state. In an exemplary embodiment, the third and fourth control signals can each be a ground voltage level.

The battery management system 90 is provided to determine battery cell voltage values associated with the first, second, third, fourth battery cells 91, 92, 93, 94, and to determine overvoltage fault bits associated with the battery cells 91, 92, 93, 94. The battery management system 90 includes a voltage monitoring IC 200, a microcontroller 210, and a serial communication bus 220.

The voltage monitoring IC 200 is provided to measure battery cell voltages of the first, second, third, fourth battery cells 91, 92, 93, 94 and to generate associated battery cell voltage values. The voltage monitoring IC 200 is further provided to generate overvoltage fault bits associated with the battery cells 91, 92, 93, 94. The voltage monitoring IC 200 includes an analog-to-digital converter (ADC) 230, and first, second, third, and fourth voltage comparators 232, 234, 236, 238.

The ADC 230 includes ADC differential channels 251, 252, 253, 254 for measuring battery cell voltages of the first, second, third, fourth battery cells 91, 92, 93, 94, respectively.

The ADC differential channel 251 has input pins P1, P2 which are electrically coupled to the positive terminal 100 and the negative terminal 102, respectively, of the first battery cell 91 to measure an output voltage of the first battery cell 91 between the terminals 100, 102, and the analog-to-digital converter 230 generates a battery cell voltage value based on the measured output voltage.

The ADC differential channel 252 has input pins P3, P4 which are electrically coupled to the positive terminal 110 and the negative terminal 112, respectively, of the second battery cell 92 to measure an output voltage of the second battery cell 92 between the terminals 110, 112, and the analog-to-digital converter 230 generates a battery cell voltage value based on the measured output voltage.

The ADC differential channel 253 has input pins P5, P6 which are electrically coupled to the positive terminal 120 and the negative terminal 122, respectively, of the third battery cell 93 to measure an output voltage of the third battery cell 93 between the terminals 120, 122, and the analog-to-digital converter 230 generates a battery cell voltage value based on the measured output voltage.

The ADC differential channel 254 has input pins P7, P8 which are electrically coupled to the positive terminal 130 and the negative terminal 132, respectively, of the fourth battery cell 94 to measure an output voltage of the fourth battery cell 94 between the terminals 130, 132, and the analog-to-digital converter 230 generates a battery cell voltage value based on the measured output voltage.

The first voltage comparator 232 is electrically coupled to the input pins P1, P2 of the ADC differential channel 251, and compares the output voltage (between input pins P1, P2) of the first battery cell 91 to a voltage comparator threshold voltage. If the output voltage of the first battery cell 91 is greater than the voltage comparator threshold voltage indicating a cell overvoltage condition, the first voltage comparator 232 sets an associated overvoltage fault bit to a binary "1" value (i.e., a fault value). Otherwise, the first voltage comparator 232 sets the associated overvoltage fault bit to a binary "0" value (i.e., a non-fault value).

The second voltage comparator 234 is electrically coupled to the input pins P3, P4 of the ADC differential channel 252, and compares the output voltage (between input pins P3, P4) of the second battery cell 92 to a voltage comparator threshold voltage. If the output voltage of the second battery cell 92 is greater than the voltage comparator threshold voltage indicating a cell overvoltage condition, the second voltage comparator 234 sets an associated overvoltage fault bit to a binary "1" value (i.e., a fault value). Otherwise, the second voltage comparator 234 sets the associated overvoltage fault bit to a binary "0" value.

The third voltage comparator 236 is electrically coupled to the input pins P5, P6 of the ADC differential channel 253, and compares the output voltage (between input pins P5, P6) of the third battery cell 93 to a voltage comparator threshold voltage. If the output voltage of the third battery cell 93 is greater than the voltage comparator threshold voltage indicating a cell overvoltage condition, the third voltage comparator 236 sets an associated overvoltage fault bit to a binary "1" value (i.e., a fault value). Otherwise, the third voltage comparator 236 sets the associated overvoltage fault bit to a binary "0" value.

The fourth voltage comparator 238 is electrically coupled to the input pins P7, P8 of the ADC differential channel 254, and compares the output voltage (between input pins P7, P8) of the fourth battery cell 94 to a voltage comparator threshold voltage. If the output voltage of the fourth battery cell 94 is greater than the voltage comparator threshold voltage indicating a cell overvoltage condition, the fourth voltage comparator 238 sets an associated overvoltage fault bit to a binary "1" value (i.e., a fault value). Otherwise, the fourth voltage comparator 238 sets the associated overvoltage fault bit to a binary "0" value.

Referring to FIGS. 1-3, the voltage monitoring IC 200 operably communicates with the microcontroller 210 via the serial communication bus 220. In particular, referring to FIG. 2, the voltage monitoring IC 200 receives a message 400 from the microcontroller 210. The message 400 includes a binary command (e.g., 1111) that instructs the voltage monitoring IC 200 to send overvoltage fault bits associated with the first, second, third, fourth battery cells 91, 92, 93, 94 to the microcontroller 210. In response, the voltage monitoring IC 200 sends a message 450 to the microcontroller 210 via the serial communication bus 220. The message 452 includes overvoltage fault bits associated with the first, second, third, fourth battery cells 91, 92, 93, 94, a CRC diagnostic bit, a communication time-out bit, a timing error bit, and a CRC value.

Each of the overvoltage fault bits in the message 450 are either a binary "0" value indicating a battery cell voltage within a desired range, or a binary "1" value indicating overvoltage condition of associated battery cell. For example, the overvoltage fault bits "0000" indicate that none of the battery cells 91-94 have an overvoltage condition. Further for example, the overvoltage fault bits "1111" indicate that all of the battery cells 91-94 have an overvoltage condition.

The CRC diagnostic bit in the message 450 is either a binary "0" value indicating a desired CRC condition, or a binary "1" value indicating a CRC fault condition. A CRC fault condition occurs when the CRC value in the message 400 that was generated by the microcontroller 210 is not equal to a CRC value calculated by the voltage monitoring IC 200 based on the binary command received in the message 400. A CRC fault condition can occur when at least a portion of the bits associated with the binary command in the message 400 are corrupted during transmission through the serial communication bus 220. A CRC non-fault condition occurs when the CRC value in the message 400 that was generated by the microcontroller 210 is equal to a CRC value calculated by the voltage monitoring IC 200 based on the binary command received in the message 400.

The communication time-out bit in the message 450 is either a binary "0" value indicating a desired communication time-out condition, or a binary "1" value indicating a communication time-out fault condition. A communication time-out fault condition occurs when the voltage monitoring IC 200 receives only some of the bits (e.g., 1 bit) of the binary command and does not receive the CRC value in the message 400. The desired communication time-out condition occurs when the voltage monitoring IC 200 receives all of the bits of the binary command and the CRC value in the message 400.

The timing error bit in the message 450 is either a binary "0" value indicating a desired timing condition, or a binary "1" value indicating a timing error fault condition. A timing air fault condition occurs when the voltage monitoring IC 200 receives most of the bits (e.g., 3 bits) of the binary command (but not all of the bits in the binary command) in the message 400 and receives the CRC value in the message 400. The desired timing condition occurs when the voltage monitoring IC 200 receives all of the bits of the binary command and the CRC value in the message 400.

The CRC value in the message 450 is determined using a CRC algorithm in the voltage monitoring IC and is based on the overvoltage fault bits, the CRC diagnostic bit, the communication time-out bit, and the timing error bit.

The microcontroller 210 is provided to control operation of the contactor 40 and to request the overvoltage fault bits associated with the first, second, third, fourth battery cells 91, 92, 93, 94 from the voltage monitoring IC 200. The microcontroller 210 includes a microprocessor 300, a digital input-output device 302, a flash memory device 304, and a persistent memory device 308. The persistent memory device 308 includes first, second, third, fourth, fifth, sixth memory locations 321, 322, 323, 324, 325, 326. The microprocessor 300 is operably coupled to the digital input-output device 302, the flash memory device 304, and the persistent memory device 308. The digital input-output device 302 is electrically coupled to the voltage drivers 60, 62 via the electrical lines 74, 78, respectively.

Figure 9:
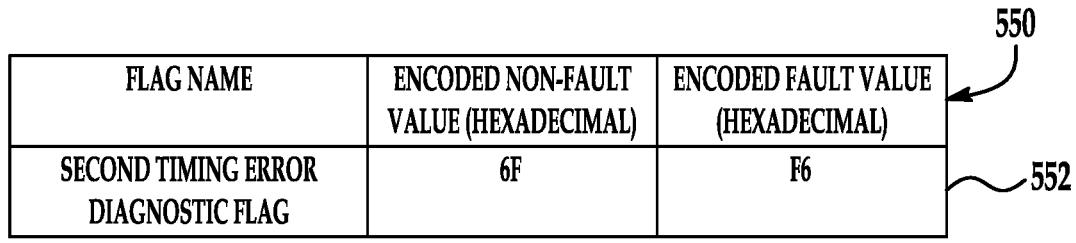
FIG. 9 is a table having an encoded fault value and an encoded non-fault value for a second timing error diagnostic flag utilized in the battery management system of FIG. 1.
Figure 10:
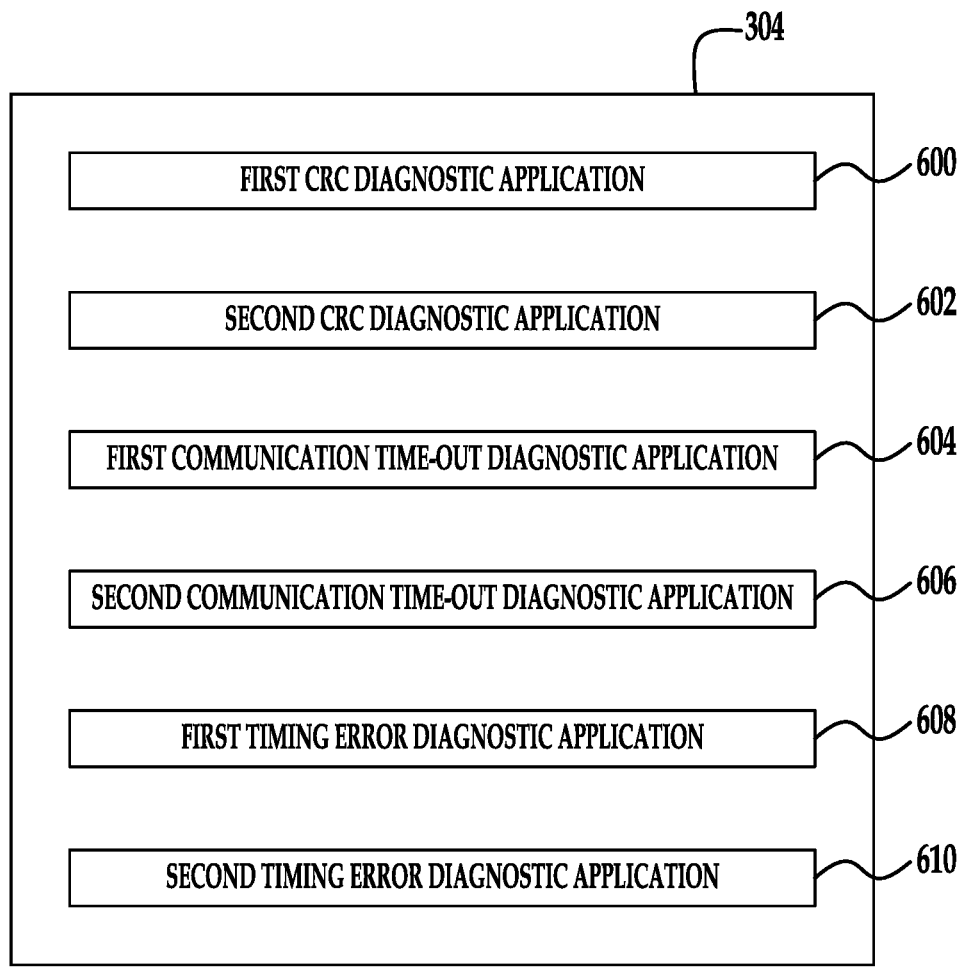
FIG. 10 is a block diagram of first and second CRC diagnostic applications, first and second communication time-out diagnostic applications, and first and second timing error diagnostic applications.

Referring to FIGS. 1 and 10, the flash memory device 304 includes a first CRC diagnostic application 600, a second CRC diagnostic application 602, a first communication time-out diagnostic application 604, a second communication time-out diagnostic application 606, a first timing error diagnostic application 608, and a second timing error diagnostic application 610 stored therein which are executed by the microprocessor 300. Further, referring to FIGS. 1 and 4-9, the memory device 308 stores tables 500, 510, 520, 530, 540, 550 therein.

The tables 500, 510, 520, 530, 540, 550 will now be explained.

Referring to FIGS. 4 and 10, a table 500 having a record 502 with an encoded fault value (e.g., 6C hexadecimal) and an encoded non-fault value (e.g., C6 hexadecimal) for a first CRC diagnostic flag is illustrated. The first CRC diagnostic flag is set to either the encoded fault value or the encoded non-fault value of the record 502, and is utilized by the first CRC diagnostic application 600.

Referring to FIGS. 5 and 10, a table 510 having a record 512 with an encoded fault value (e.g., 93 hexadecimal) and an encoded non-fault value (e.g., 39 hexadecimal) for a second CRC diagnostic flag is illustrated. The second CRC diagnostic flag is set to either the encoded fault value or the encoded non-fault value of the record 512, and is utilized by the second CRC diagnostic application 602.

Figure 6:
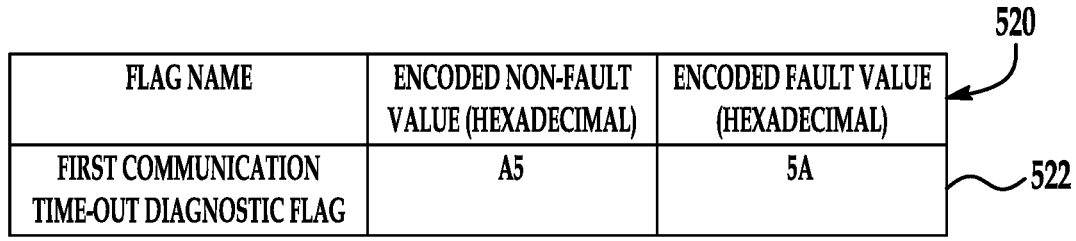
FIG. 6 is a table having an encoded fault value and an encoded non-fault value for a first communication time-out diagnostic flag utilized in the battery management system of FIG. 1.

Referring to FIGS. 6 and 10, a table 520 having a record 522 with an encoded fault value (e.g., 5A hexadecimal) and an encoded non-fault value (e.g., A5 hexadecimal) for a first communication time-out diagnostic flag is illustrated. The first communication time-out diagnostic flag is set to either the encoded fault value or the encoded non-fault value of the record 522, and is utilized by the first communication time-out diagnostic application 604.

Figure 7:
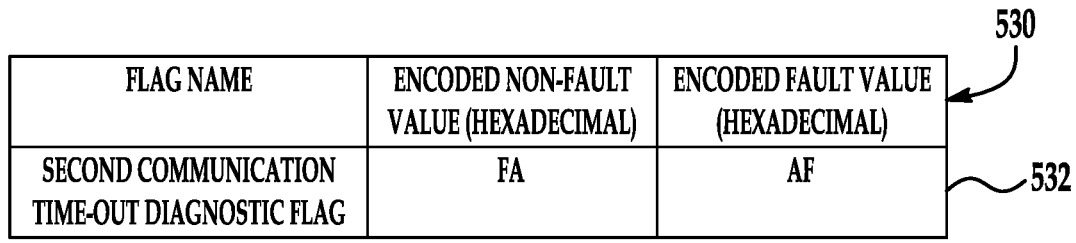
FIG. 7 is a table having an encoded fault value and an encoded non-fault value for a second communication time-out diagnostic flag utilized in the battery management system of FIG. 1.

Referring to FIGS. 7 and 10, a table 530 having a record 532 with an encoded fault value (e.g., AF hexadecimal) and an encoded non-fault value (e.g., FA hexadecimal) for a second communication time-out diagnostic flag is illustrated. The second communication time-out diagnostic flag is set to either the encoded fault value or the encoded non-fault value of the record 532, and is utilized by the second communication time-out diagnostic application 606.

Figure 8:
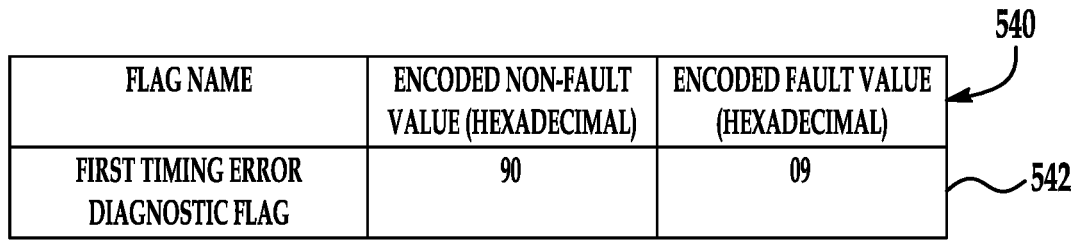
FIG. 8 is a table having an encoded fault value and an encoded non-fault value for a first timing error diagnostic flag utilized in the battery management system of FIG. 1.

Referring to FIGS. 8 and 10, a table 540 having a record 542 with an encoded fault value (e.g., 09 hexadecimal) and an encoded non-fault value (e.g., 90 hexadecimal) for a first timing error diagnostic flag is illustrated. The first timing error diagnostic flag is set to either the encoded fault value or the encoded non-fault value in the record 542, and is utilized by the first timing error diagnostic application 608.

Referring to FIGS. 9 and 10, a table 550 having a record 552 with an encoded fault value (e.g., F6 hexadecimal) and an encoded non-fault value (e.g., 6F hexadecimal) for a second timing error diagnostic flag is illustrated. The second timing error diagnostic flag is set to either the encoded fault value or the encoded non-fault value of the record 552, and is utilized by the second timing error diagnostic application 610.

Referring to FIGS. 4-9, the encoded fault values and encoded non-fault values in each of the tables 500, 510, 520, 530, 540, 550 each have a Hamming distance of at least four from one another.

Figure 11:
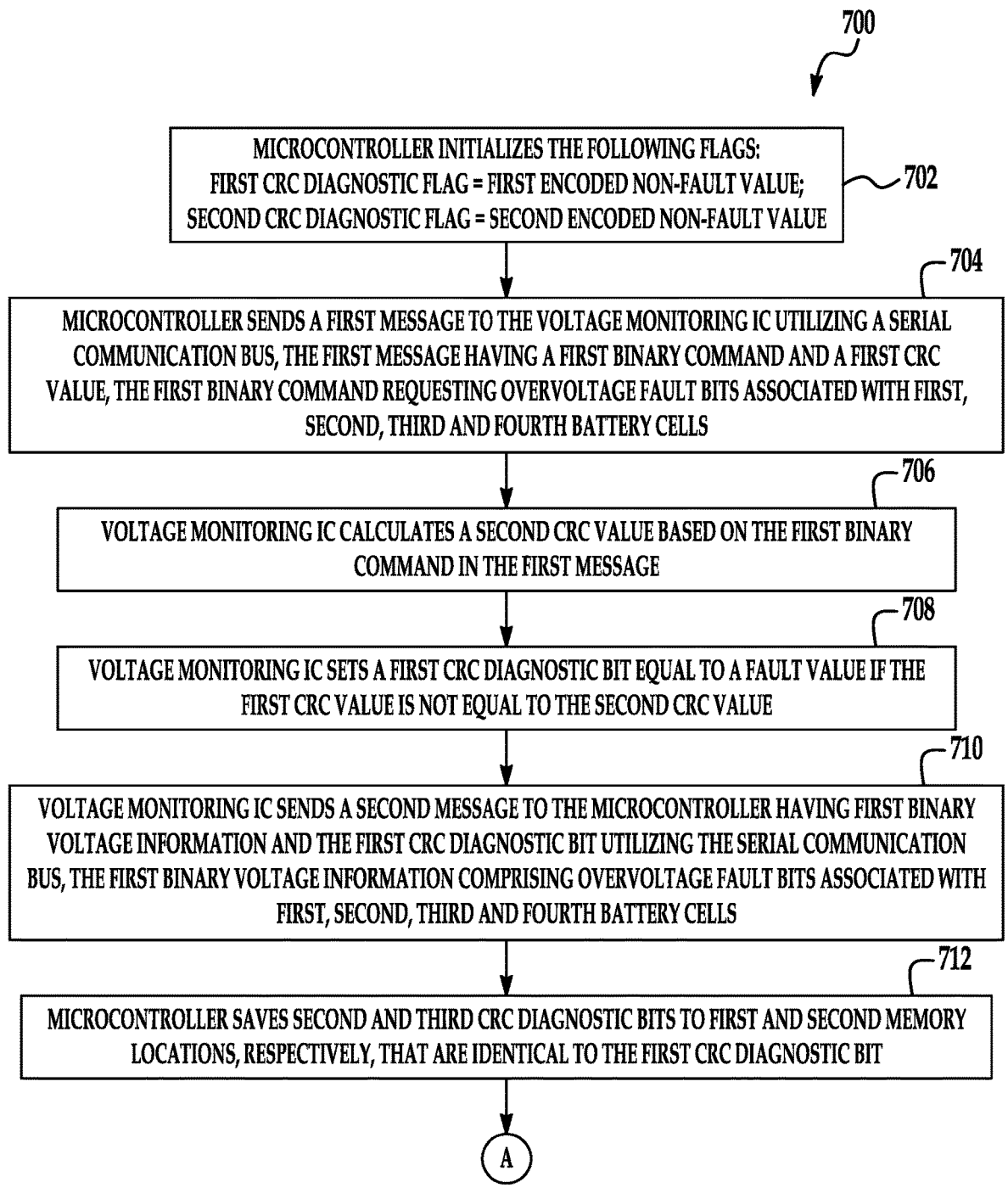
FIGS. 11-12 are flowcharts of a first diagnostic method utilized by the battery management system of FIG. 1.
Figure 12:
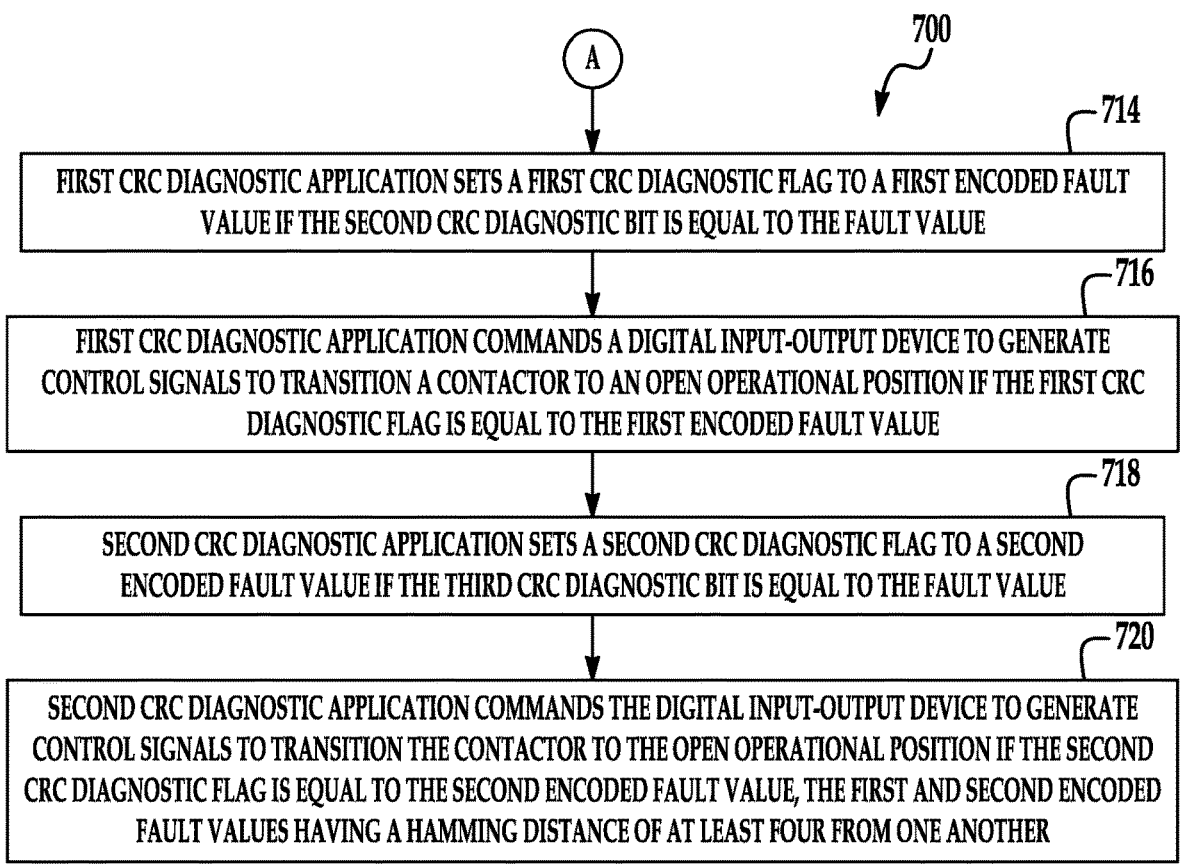

Referring to FIGS. 1 and 11-12, a flowchart of a method 700 for determining when communication faults are detected at a voltage monitoring IC 200 that receives messages from the microcontroller 210 via a serial communication bus 220, utilizing first and second CRC diagnostic flags, will be explained.

At step 702, the microcontroller 210 initializes the following flags: first CRC diagnostic flag=first encoded non-fault value (e.g., C6 hexadecimal from table 500 in FIG. 4); and second CRC diagnostic flag=second encoded non-fault value (e.g., 39 hexadecimal from table 510 in FIG. 5).

At step 704, the microcontroller 210 sends a first message to the voltage monitoring IC 200 utilizing a serial communication bus 220. The first message has a first binary command and a first CRC value. The first binary command requests overvoltage fault bits associated with first, second, third and fourth battery cells 91, 92, 93, 94.

At step 706, the voltage monitoring IC 200 calculates a second CRC value based on the first binary command in the first message.

At step 708, the voltage monitoring IC 200 sets a first CRC diagnostic bit equal to a fault value if the first CRC value is not equal to the second CRC value.

At step 710, the voltage monitoring IC 200 sends a second message to the microcontroller 210 having first binary voltage information and the first CRC diagnostic bit utilizing the serial communication bus 220. The first binary voltage information comprises overvoltage fault bits associated with first, second, third and fourth battery cells 91, 92, 93, 94.

At step 712, the microcontroller 210 saves second and third CRC diagnostic bits to first and second memory locations 321, 322, respectively, that are identical to the first CRC diagnostic bit. For example, if the first CRC diagnostic bit is binary "1", then the second and third CRC diagnostic bits would be saved as binary "1."

At step 714, the first CRC diagnostic application 600 sets a first CRC diagnostic flag to a first encoded fault value (e.g., 6C hexadecimal from table 500 in FIG. 4) if the second CRC diagnostic bit is equal to the fault value.

At step 716, the first CRC diagnostic application 600 commands a digital input-output device 302 to generate control signals to transition a contactor 40 to an open operational position if the first CRC diagnostic flag to the first encoded fault value.

At step 718, the second CRC diagnostic application 602 sets a second CRC diagnostic flag to a second encoded fault value (e.g., 93 hexadecimal from table 510 in FIG. 5) if the third CRC diagnostic bit is equal to the fault value.

At step 720, the second CRC diagnostic application 602 commands the digital input-output device 302 to generate control signals to transition the contactor 40 to the open operational position if the second CRC diagnostic flag to the second encoded fault value. The first and second encoded fault values have a Hamming distance of at least four from one another. After step 720, the method is exited.

Figure 13:
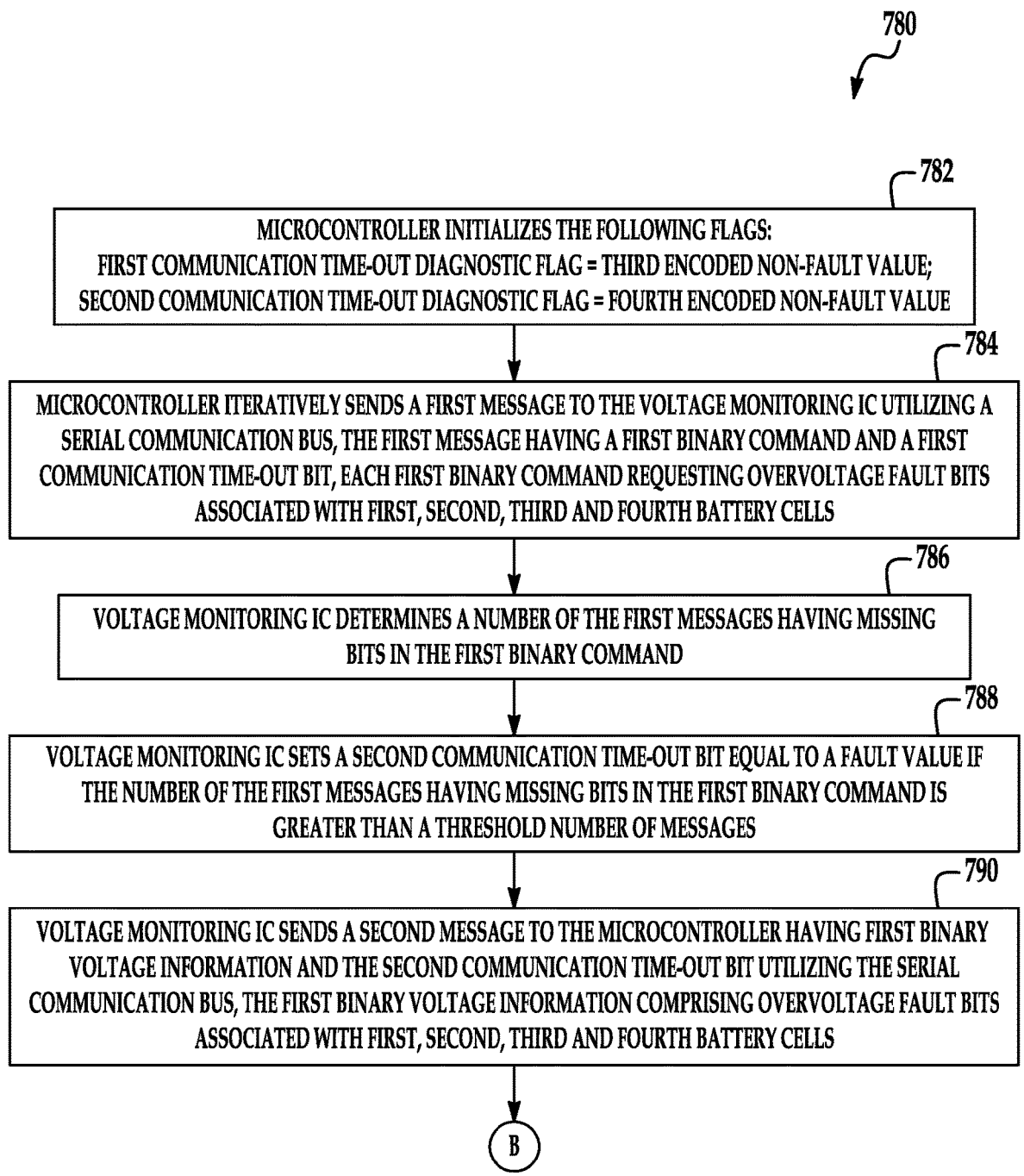
FIGS. 13-14 are flowcharts of a second diagnostic method utilized by the battery management system of FIG. 1.
Figure 14:
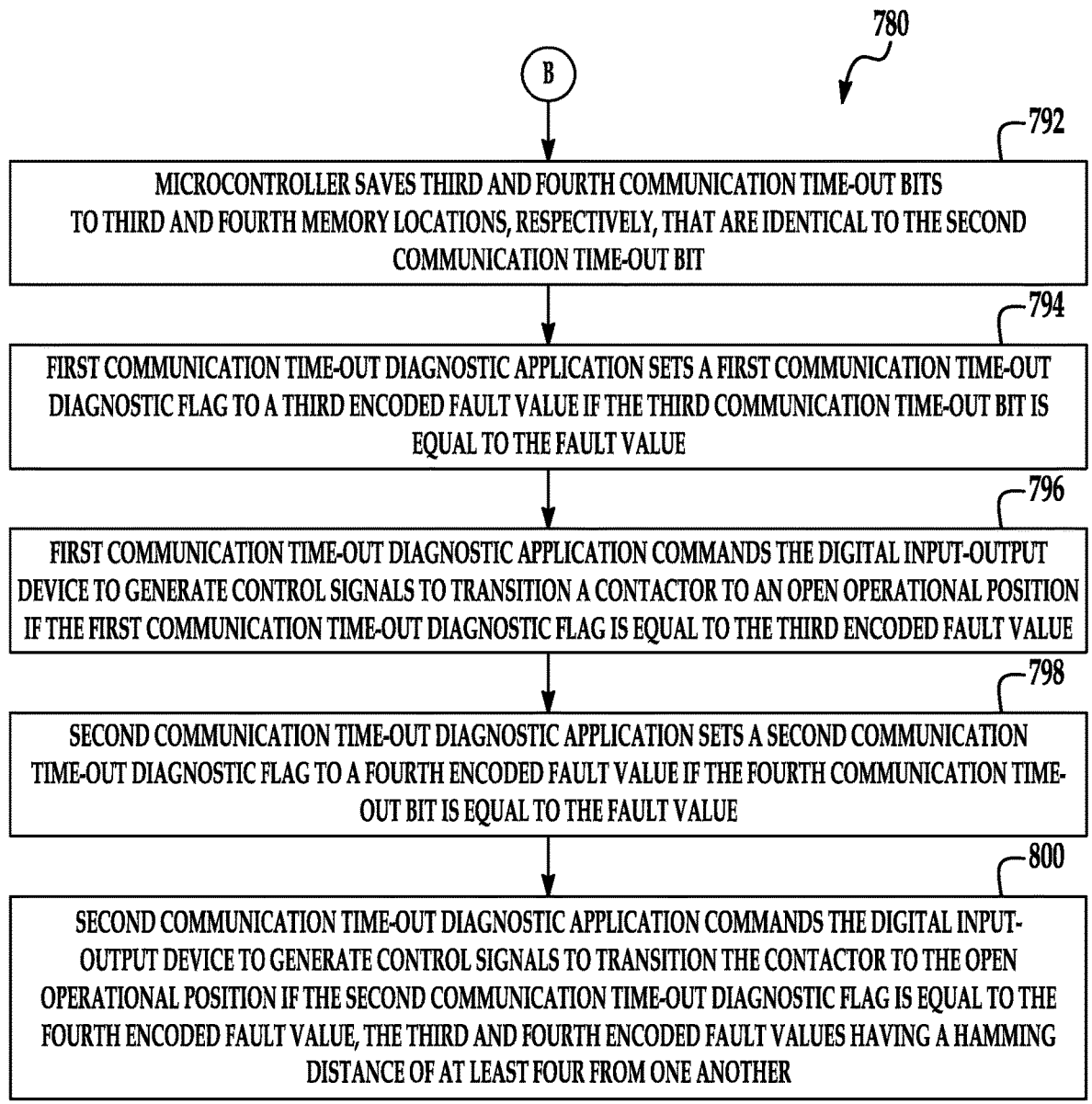

Referring to FIGS. 1 and 13-14, a flowchart of a method 780 for determining when communication faults are detected at a voltage monitoring IC 200 that receives messages from the microcontroller 210 via a serial communication bus 220, utilizing first and second communication time-out diagnostic flags, will be explained.

At step 782, the microcontroller 210 initializes the following flags: first communication time-out diagnostic flag=third encoded non-fault value (e.g., A5 hexadecimal from table 520 in FIG. 6); second communication time-out diagnostic flag=fourth encoded non-fault value (e.g., FA hexadecimal from table 530 in FIG. 7).

At step 784, the microcontroller 210 iteratively sends a first message to the voltage monitoring IC 200 utilizing a serial communication bus 220. Each first message has a first binary command and a first communication time-out bit. Each first binary command requests overvoltage fault bits associated with first, second, third and fourth battery cells 91, 92, 93, 94.

At step 786, the voltage monitoring IC 200 determines a number of the first messages having missing bits in the first binary command.

At step 788, the voltage monitoring IC 200 sets a second communication time-out bit equal to a fault value if the number of the first messages having missing bits in the first binary command is greater than a threshold number of messages.

At step 790, the voltage monitoring IC 200 sends a second message to the microcontroller 210 having first binary voltage information and the second communication time-out bit utilizing the serial communication bus 220. The first binary voltage information comprises overvoltage fault bits associated with first, second, third and fourth battery cells 91, 92, 93, 94.

At step 792, the microcontroller 210 saves third and fourth communication time-out bits to third and fourth memory locations 323, 324, respectively, that are identical to the second communication time-out bit.

At step 794, the first communication time-out diagnostic application 604 sets a first communication time-out diagnostic flag to a third encoded fault value (e.g., 5A hexadecimal from table 520 in FIG. 6) if the third communication time-out bit is equal to the fault value.

At step 796, the first communication time-out diagnostic application 604 commands the digital input-output device 302 to generate control signals to transition a contactor 40 to an open operational position if the first communication time-out diagnostic flag is equal to the third encoded fault value.

At step 798, the second communication time-out diagnostic application 606 sets a second communication time-out diagnostic flag to a fourth encoded fault value (e.g., AF hexadecimal from table 530 in FIG. 7) if the fourth communication time-out bit is equal to the fault value.

At step 800, the second communication time-out diagnostic application 606 commands the digital input-output device 302 to generate control signals to transition the contactor 40 to the open operational position if the second communication time-out diagnostic flag is equal to the fourth encoded fault value. The third and fourth encoded fault values have a Hamming distance of at least four from one another. After step 800, the method is exited.

Figure 15:
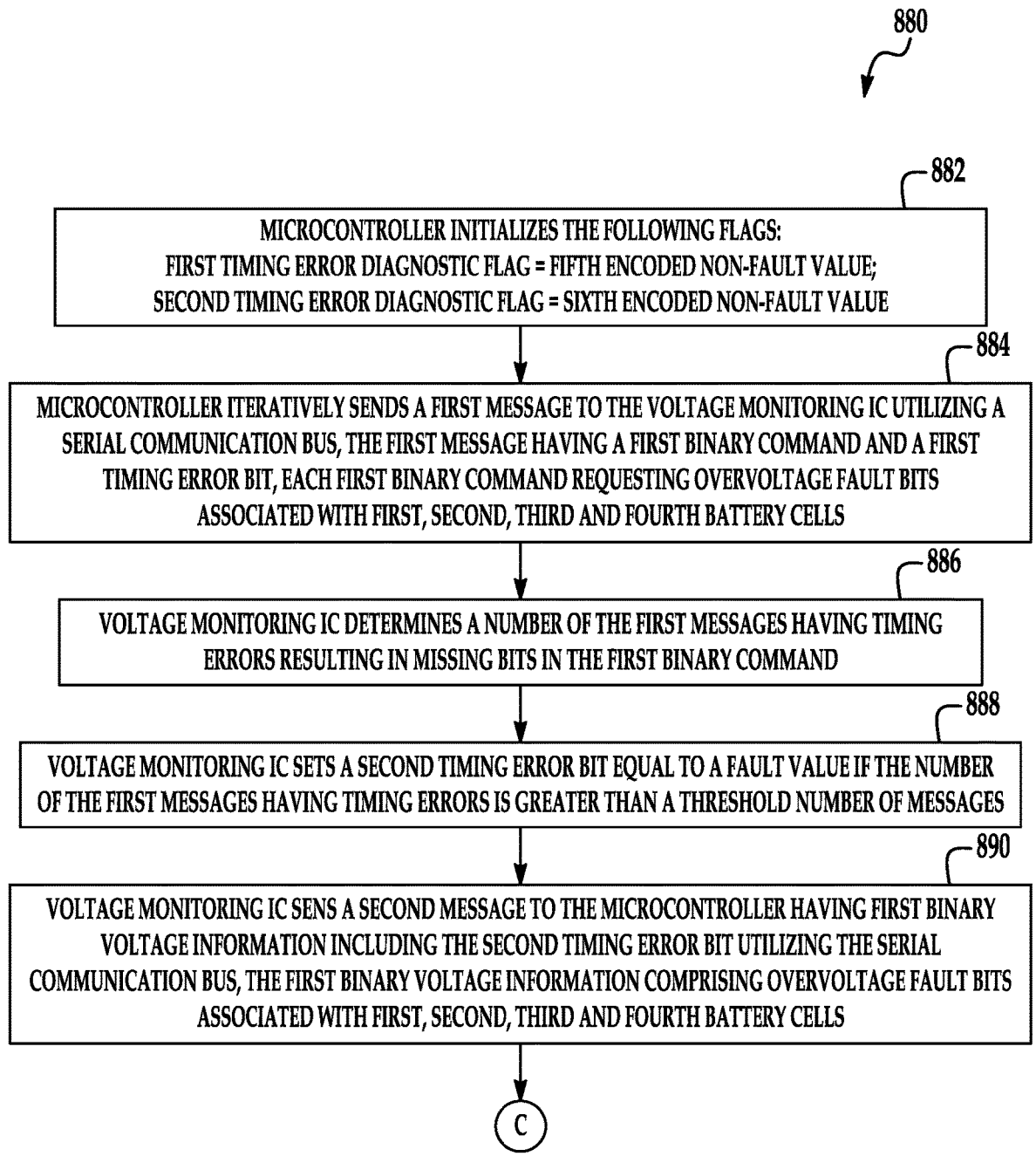
FIGS. 15-16 are flowcharts of a third diagnostic method utilized by the battery management system of FIG. 1.
Figure 16:
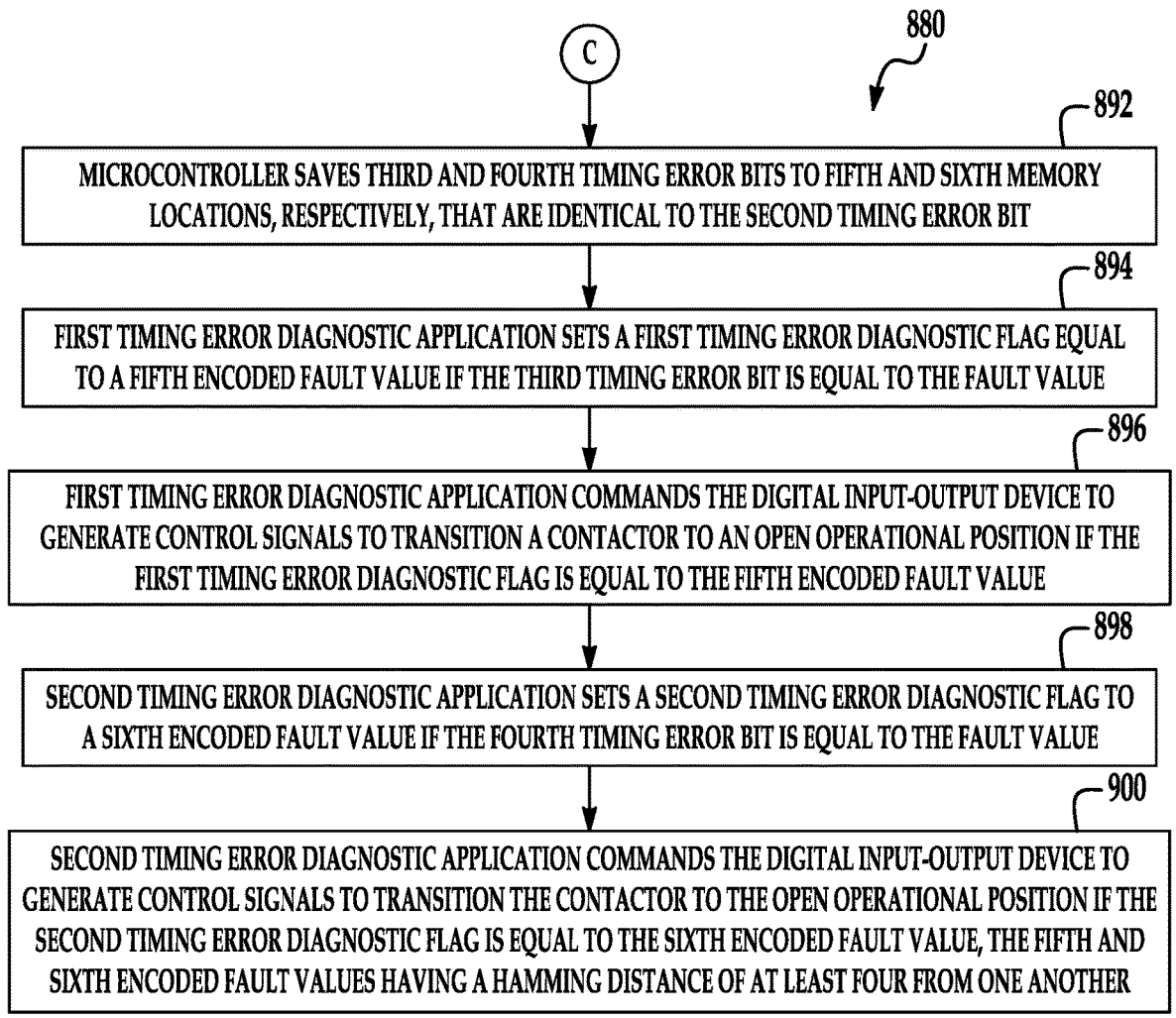

Referring to FIGS. 1 and 15-16, a flowchart of a method 880 for determining when communication faults are detected at a voltage monitoring IC 200 that receives messages from the microcontroller 210 via a serial communication bus 220, utilizing first and second timing error diagnostic flags, will be explained.

At step 882, the microcontroller 210 initializes the following flags: first timing error diagnostic flag=fifth encoded non-fault value (e.g., 90 hexadecimal from table 540 in FIG. 8); second timing error diagnostic flag=sixth encoded non-fault value (e.g., 6F hexadecimal from table 550 in FIG. 9).

At step 884, the microcontroller 210 iteratively sends a first message to the voltage monitoring IC 200 utilizing a serial communication bus 220. Each first message has a first binary command and a first timing error bit. Each first binary command requests overvoltage fault bits associated with first, second, third and fourth battery cells 91, 92, 93, 94.

At step 886, the voltage monitoring IC 200 determines a number of the first messages having timing errors resulting in missing bits in the first binary command.

At step 888, the voltage monitoring IC 200 sets a second timing error bit equal to a fault value if the number of the first messages having timing errors is greater than a threshold number of messages.

At step 890, the voltage monitoring IC 200 sends a second message to the microcontroller 210 having first binary voltage information including the second timing error bit utilizing the serial communication bus 220. The first binary voltage information comprises overvoltage fault bits associated with first, second, third and fourth battery cells 91, 92, 93, 94.

At step 892, the microcontroller 210 saves third and fourth timing error bits to fifth and sixth memory locations 325, 326, respectively, that are identical to the second timing error bit.

At step 894, the first timing error diagnostic application 608 sets a first timing error diagnostic flag equal to a fifth encoded fault value (e.g., 09 hexadecimal from table 540 in FIG. 8) if the third timing error bit is equal to the fault value.

At step 896, the first timing error diagnostic application 608 commands the digital input-output device 302 to generate control signals to transition a contactor 40 to an open operational position if the first timing error diagnostic flag is equal to the fifth encoded fault value.

At step 898, the second timing error diagnostic application 610 sets a second timing error diagnostic flag to a sixth encoded fault value (e.g., F6 hexadecimal from table 550 in FIG. 9) if the fourth timing error bit is equal to the fault value.

At step 900, the second timing error diagnostic application 610 commands the digital input-output device 302 to generate control signals to transition the contactor 40 to the open operational position if the second timing error diagnostic flag to the sixth encoded fault value. The fifth and sixth encoded fault values have a Hamming distance of at least four from one another.

The battery management system described herein provides a substantial advantage over other battery management systems. In particular, the battery management system described herein has a technical effect of redundantly determining when communication faults are detected at a voltage monitoring IC that receives messages from the microcontroller via a serial communication bus, utilizing first and second diagnostic flags, and to redundantly take safe action if either of the first and second diagnostic flags indicate a fault condition.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery management system, comprising:
a microcontroller having first and second applications;
a voltage monitoring IC operably coupled to the microcontroller utilizing a serial communication bus;
the microcontroller sending a first message to the voltage monitoring IC, the first message having first binary command and a first CRC value;
the voltage monitoring IC calculating a second CRC value based on the first binary command in the first message;
the voltage monitoring IC setting a first CRC diagnostic bit equal to a fault value if the first CRC value is not equal to the second CRC value;
the voltage monitoring IC sending a second message to the microcontroller having first binary voltage information and the first CRC diagnostic bit;
the microcontroller saving second and third CRC diagnostic bits to first and second memory locations, respectively, that are identical to the first CRC diagnostic bit;
the first application setting a first CRC diagnostic flag to a first encoded fault value if the second CRC diagnostic bit is equal to the fault value;
the first application transitioning a contactor to an open operational position if the first CRC diagnostic flag is equal to the first encoded fault value;
the second application setting a second CRC diagnostic flag to a second encoded fault value if the third CRC diagnostic bit is equal to the fault value; and
the second application transitioning the contactor to the open operational position if the second CRC diagnostic flag is equal to the second encoded fault value, the first and second encoded fault values having a Hamming distance of at least four from one another.

2. The battery management system of claim 1, wherein the first binary command instructs the voltage monitoring IC to send at least an overvoltage fault bit associated with a first battery cell to the microcontroller.

3. The battery management system of claim 1, wherein the first binary voltage information is at least an overvoltage fault bit associated with the first battery cell.

4. A battery management system, comprising:
a microcontroller having first and second applications;
a voltage monitoring IC operably coupled to the microcontroller utilizing a serial communication bus;
the microcontroller iteratively sending a first message to the voltage monitoring IC, each first message having a first binary command and a first communication time-out bit;
the voltage monitoring IC determining a number of the first messages having missing bits in the first binary command;
the voltage monitoring IC setting a second communication time-out bit equal to a fault value if the number of the first messages having missing bits in the first binary command is greater than a threshold number of messages;
the voltage monitoring IC sending a second message to the microcontroller having first binary voltage information and the second communication time-out bit;
the microcontroller saving third and fourth communication time-out bits to first and second memory locations, respectively, that are identical to the second communication time-out bit;
the first application setting a first communication time-out diagnostic flag to a first encoded fault value if the third communication time-out bit is equal to the fault value;
the first application transitioning a contactor to an open operational position if the first communication time-out diagnostic flag is equal to the first encoded fault value;
the second application setting a second communication time-out diagnostic flag to a second encoded fault value if the fourth communication time-out bit is equal to the fault value; and
the second application transitioning the contactor to the open operational position if the second communication time-out diagnostic flag is equal to the second encoded fault value, the first and second encoded fault values having a Hamming distance of at least four from one another.

5. The battery management system of claim 4, wherein the first binary command instructs the voltage monitoring IC to send at least an overvoltage fault bit associated with a first battery cell to the microcontroller.

6. The battery management system of claim 5, wherein the first binary voltage information is at least an overvoltage fault bit associated with the first battery cell.

7. A battery management system, comprising:
a microcontroller having first and second applications;
a voltage monitoring IC operably coupled to the microcontroller utilizing a serial communication bus;
the microcontroller iteratively sending a first message to the voltage monitoring IC, each first message having a first binary command and a first timing error bit;
the voltage monitoring IC determining a number of the first messages having timing errors resulting in missing bits in the first binary command;
the voltage monitoring IC setting a second timing error bit equal to a fault value if the number of the first messages having timing errors is greater than a threshold number of messages;
the voltage monitoring IC sending a second message to the microcontroller having first binary voltage information and the second timing error bit;
the microcontroller saving third and fourth timing error bits to first and second memory locations, respectively, that are identical to the second timing error bit;
the first application setting a first timing error diagnostic flag equal to a first encoded fault value if the third timing error bit is equal to the fault value;
the first application transitioning a contactor to an open operational position if the first timing error diagnostic flag is equal to the first encoded fault value;
the second application setting a second timing error diagnostic flag to a second encoded fault value if the fourth timing error bit is equal to the fault value; and
the second application transitioning the contactor to the open operational position if the second timing error diagnostic flag is equal to the second encoded fault value, the first and second encoded fault values having a Hamming distance of at least four from one another.

8. The battery management system of claim 7, wherein the first binary command instructs the voltage monitoring IC to send at least an overvoltage fault bit associated with a first battery cell to the microcontroller.

9. The battery management system of claim 7, wherein the first binary voltage information is at least an overvoltage fault bit associated with the first battery cell.

* * * * *